United States Patent
Ilkov et al.

(10) Patent No.: US 9,479,126 B2
(45) Date of Patent: Oct. 25, 2016

(54) SYSTEM AND METHOD FOR A LOW NOISE AMPLIFIER

(71) Applicant: Infineon Technologies AG, Neubiberg (DE)

(72) Inventors: Nikolay Ilkov, Munich (DE); Paulo Oliveira, Neubiberg (DE); Winfried Bakalski, Munich (DE); Daniel Kehrer, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/462,793

(22) Filed: Aug. 19, 2014

(65) Prior Publication Data

US 2016/0056774 A1 Feb. 25, 2016

(51) Int. Cl.
*H03F 1/14* (2006.01)
*H03F 1/56* (2006.01)
*H03F 3/19* (2006.01)
*H03F 1/02* (2006.01)

(52) U.S. Cl.
CPC ............ *H03F 1/565* (2013.01); *H03F 1/0205* (2013.01); *H03F 3/19* (2013.01); *H03F 2200/213* (2013.01); *H03F 2200/222* (2013.01); *H03F 2200/252* (2013.01); *H03F 2200/294* (2013.01); *H03F 2200/421* (2013.01); *H03F 2200/451* (2013.01)

(58) Field of Classification Search
CPC ...... H03F 3/19; H03F 3/72; H03F 2200/294; H03F 2203/7239; H03G 1/0088
USPC ...... 330/9, 51, 109, 124 D, 124 R, 150, 151, 330/207 P, 254, 288, 298, 307; 455/13.3, 455/553.1
See application file for complete search history.

(56) References Cited

U.S. PATENT DOCUMENTS

| | | |
|---|---|---|
| 6,118,338 A | 9/2000 | Frank et al. |
| 6,211,729 B1 | 4/2001 | Morkner et al. |
| 6,586,993 B2 * | 7/2003 | Macedo ............... H03F 1/302 330/149 |
| 6,680,647 B2 | 1/2004 | Brown et al. |
| 6,700,439 B2 | 3/2004 | Jackson |
| 6,838,933 B2 | 1/2005 | Goyette et al. |
| 6,864,743 B2 | 3/2005 | Pozdeev |
| 6,930,546 B2 | 8/2005 | Floyd |
| 7,675,359 B2 * | 3/2010 | Vice ..................... H03F 1/0277 330/124 D |
| 7,898,325 B2 | 3/2011 | Hasan Abrar |
| 8,643,433 B2 * | 2/2014 | Ho ....................... H03F 1/0277 330/151 |

FOREIGN PATENT DOCUMENTS

| | | | | |
|---|---|---|---|---|
| JP | 2008028908 A | * | 2/2008 | ............ H03G 3/10 |
| WO | 2013177555 A1 | | 11/2013 | |
| WO | WO 2013168665 A1 | * | 11/2013 | ............ H04B 1/525 |

OTHER PUBLICATIONS

Avago data sheet, MGA-71543 Low Noise Amplifier with Mitigated Bypass Switch, AV02-3597EN—Jun. 8, 2012.*
"2.4 GHz application using MGA-71543, a Low Noise Amplifier with Bypass Switch," Avago Technologies, Design Tip, Jul. 19, 2001, 4 pgs.
"MGA-71543—Low Noise Amplifier with Mitigated Bypass Switch," Avago Technologies, Data Sheet, Jun. 8, 2012, 24 pgs.

* cited by examiner

*Primary Examiner* — Steven J Mottola
*Assistant Examiner* — Hafizur Rahman
(74) *Attorney, Agent, or Firm* — Slater Matsil, LLP

(57) ABSTRACT

In accordance with an embodiment, a circuit includes a first signal path coupled between an input port and an output port, and a second coupled between the input port and the output port in parallel with the first signal path. The first signal path includes a low noise amplifier (LNA) having an input node coupled to the input port, and the second signal path includes a switch coupled between the input port and the output port.

58 Claims, 10 Drawing Sheets

ACTIVE MODE

ACTIVE MODE

BYPASS MODE

ACTIVE MODE

BYPASS MODE

SYSTEM AND METHOD FOR A LOW NOISE AMPLIFIER

TECHNICAL FIELD

The present disclosure relates generally to an electronic device, and more particularly to a system and method for a low noise amplifier.

BACKGROUND

Electronic devices used with wireless communication systems, such as cellular phones, GPS receivers, and Wi-Fi enabled notebook and tablet computers, generally contain signal processing systems that have interfaces to the analog world. Such interfaces may include wire line and wireless receivers that receive transmitted power and convert the received power to an analog or digital signal that may be demodulated using analog or digital signal processing techniques. A typical wireless receiver architecture includes a low noise amplifier (LNA) that amplifies the very small signals that may be received by an antenna and passes an amplified signal to later amplification and/or signal processing stages. By providing gain at the LNA, subsequent gain processing stages are made insensitive to noise, thereby enabling a lower system noise figure.

An LNA circuit generally contains at least one transistor and an input matching network. The purpose of the input matching network, which may be made of one or more passive devices such as inductors and capacitors, is to provide an impedance match and/or a noise match to a previous stage, such as an antenna, a filter, an RF switch, or other circuit. LNA implementations may also include an output matching network, a bias network, and other circuit structures.

SUMMARY OF THE INVENTION

In accordance with an embodiment, a circuit includes a first signal path coupled between an input port and an output port, and a second coupled between the input port and the output port in parallel with the first signal path. The first signal path includes a low noise amplifier (LNA) having an input node coupled to the input port, and the second signal path includes a switch coupled between the input port and the output port.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
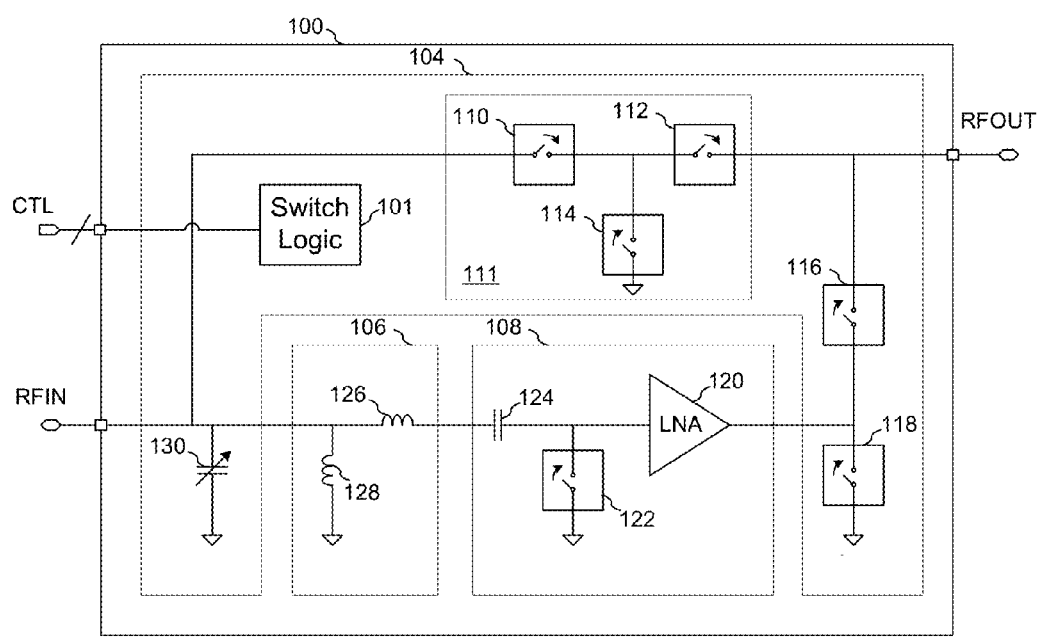
FIGS. 1a-1d illustrate an embodiment LNA modules.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a low noise amplifier (LNA) module having at least two signal paths: a first signal path that utilizes an LNA, and a second signal path the bypasses the LNA. The first signal path may be used, for example, in an RF system in which a low level RF signal is provided by an antenna, and low noise amplification is required to resolve the low level RF signal. The second signal path may be used, for example, in the RF system in which the antenna receives a RF signal having a high enough signal level to be resolved without the LNA.

An example of such a system is a cellular telephone that may operate in various signal strength environments. For example, when the cellular telephone is a considerable distance from a base station, such as on a rural highway, the received signal may be weak, and the first signal path having the LNA may be employed to resolve the weak received signal. On the other hand, when the cellular telephone is adjacent to a base station or is in an environment having multiple microcells, the received signal may be very strong and have a sufficient signal to noise ratio (SNR) to be received without using an LNA. In some cases, this signal may even be strong enough to overdrive the LNA. In such cases, the second signal path bypassing the LNA may be used. In some embodiments, the LNA may be shut down or placed in a low power mode in order to save power.

In an embodiment, the LNA is bypassed without completely removing the LNA from the circuit. For example, in some embodiments, no switches are coupled directly in series with the LNA in order to prevent additional noise in the system due to the attenuation caused by the resistance of series switches. In such embodiments, the input and output of the LNA may be coupled to an AC ground to prevent distortion caused by module input signals leaking into the LNA. However, in some embodiments, a switch may be coupled in series with the output of the LNA in order to disconnect the LNA from the bypassed signal path. In various embodiments, the noise contribution of the series output switch may have a negligible effect on the noise figure of the system because the series output switch is preceded by the gain of the LNA.

In some embodiments, the bypass switch is implemented using a "T" switching network in order to prevent capacitive coupling from the output of the LNA to the input of the LNA. By using such a "T" network, the stability of the LNA may be improved by attenuating the feedback path from the output of the LNA to the input of the LNA. In some embodiments, a stability factor of greater than 1 may be achieved.

FIG. 1a illustrates LNA module 100 according to an embodiment of the present invention. As shown, LNA module 100 has two signal paths: a first signal path starting from input terminal RFIN through matching network 106 and LNA circuit 108 to output terminal RFOUT via switch 116; and a second signal path starting from input terminal RFIN through bypass switch 111 to output terminal RFOUT. As shown, bypass switch 111 includes switches 110 and 112 coupled in series between input terminal RFIN and output terminal RFOUT, as well as switch 114 coupled between ground and an intermediate node between switches 110 and 112 in a "T" configuration. When bypass switch 111 is closed, switches 110 and 112 are turned on and switch 114 is turned off. When bypass switch 111 is open, switches 110 and 112 are turned on and switch 114 is turned on. In alternative embodiments, bypass switch 111 may be implemented using other bypass switch configurations known in the art. In an embodiment, the first signal path may be used in low signal conditions and the second signal path may be used in high signal conditions.

Figure 1B:
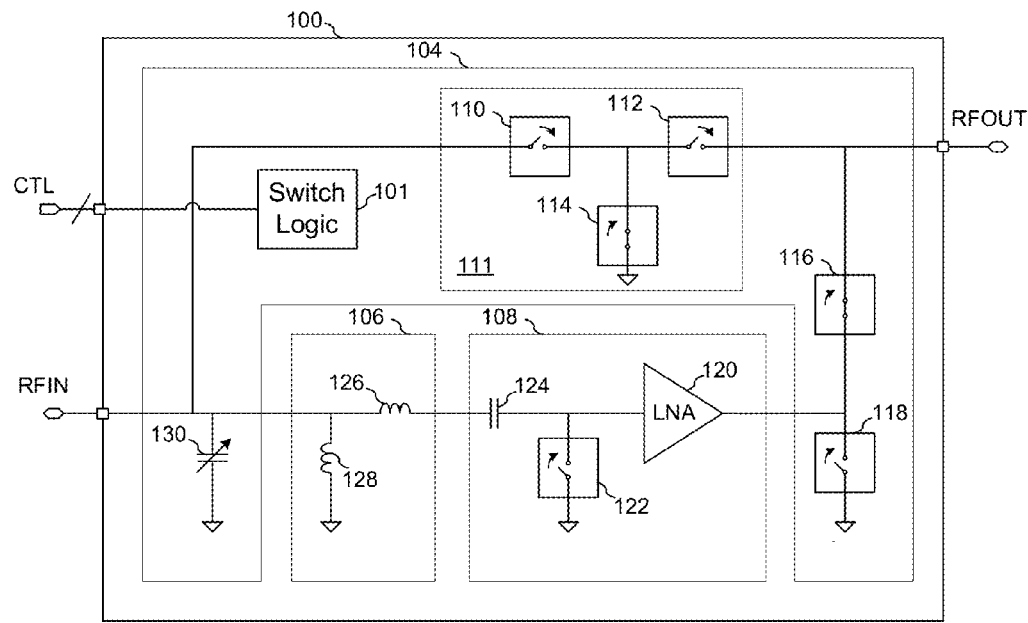

In an embodiment, the first signal path (including the LNA) is selected in an active mode by closing switches 114 and 116 and opening switches 110, 112, 118 and 122, as shown in FIG. 1b. By opening switches 110 and 112 the bypass signal path from input terminal RFIN to output terminal RFOUT is opened and/or placed in a high impedance state, thereby preventing signal conduction directly from input terminal RFIN to output terminal RFOUT. Switch 114 is closed in order to ground the parasitic feedthrough capacitance of switch 110 and switch 112 that may degrade the stability of LNA 120 in LNA circuit 108. The first signal path is activated by closing switch 116 to allow for a signal path from the output of LNA 120 to output terminal RFOUT. Switches 122 and 118 are opened to prevent the input and output of LNA 120 from being grounded.

In an embodiment, the first signal path includes matching network 106, LNA circuit 108 and switches 116 and 118. Matching network 106 in conjunction with adjustable capacitor 130 provides an adjustable impedance match to the input of LNA circuit 108 during active mode and, as well as an adjustable impedance match from input terminal RFIN to output terminal RFOUT during bypass mode when the second signal path is active. Matching network 106 includes series inductor 126 and shunt inductor 128. In an embodiment, input matching is accomplished using a parallel tunable capacitance 130, optional parallel inductance 128, series inductance 126 and series coupling capacitor 124. Inductors 126 and 128 each have a value of between about 5 nH and about 20 nH. In alternative embodiments, other component ranges and/or other matching network topologies known in the art may be used depending on the particular application and its specifications. LNA circuit 108 includes LNA 120, coupling capacitor 124, and shunt switch 122. LNA 120 may be implemented using LNA architectures known in the art. In one embodiment, LNA is implemented using a bipolar junction transistor. Alternatively, other types of transistors, such as, but not limited to, CMOS and pHEMT transistors may be used.

In an embodiment, the operation mode of LNA module 100 may be selected by providing a digital control signal via control bus CTL to switch logic 101 that controls the state of switches 110, 112, 114, 116, 118 and 122, as well as the state of adjustable capacitor 130. Control bus CTL may be implemented using a parallel digital interface and/or a series digital interface such as an SPI, IIC, RFFE or other serial interface standard. In such embodiments, switch logic 101 also includes the appropriate digital interface circuitry, as well as decoding logic that places the various switches and adjustable components on LNA module 100 in their appropriate state based on the date received from control bus CTL. In some embodiments, mode selection may be performed addressable via a signal pin, while the setting of adjustable capacitor 130 is addressable using a digital word, or other combinations thereof. In alternative embodiments of the present invention, non-standard digital interfaces may be used.

In an embodiment, tuning and switching network 104 may be implemented on a first integrated circuit and LNA circuit 108 may be implemented on a second integrated circuit, and matching network 106 may be implemented using discrete passive components, all of which are disposed on a carrier substrate and/or within a physical module or package. In some embodiments, the first integrated circuit that includes tuning and switching network 104 may be fabricated in a CMOS process while the second integrated circuit that includes LNA circuit 108 may be fabricated in a high speed Bipolar and/or BiCMOS process. In alternative embodiments of the present invention, LNA module 100 may be partitioned differently, and the respective components may be fabricated in different processes.

In an embodiment, switches 110, 112, 114, 116, 118 and 122 may be fabricated using RF switches known in the art, such as switches using stacked and/or series transistors fabricated using CMOS, PHEMT, or other technologies.

Figure 1C:
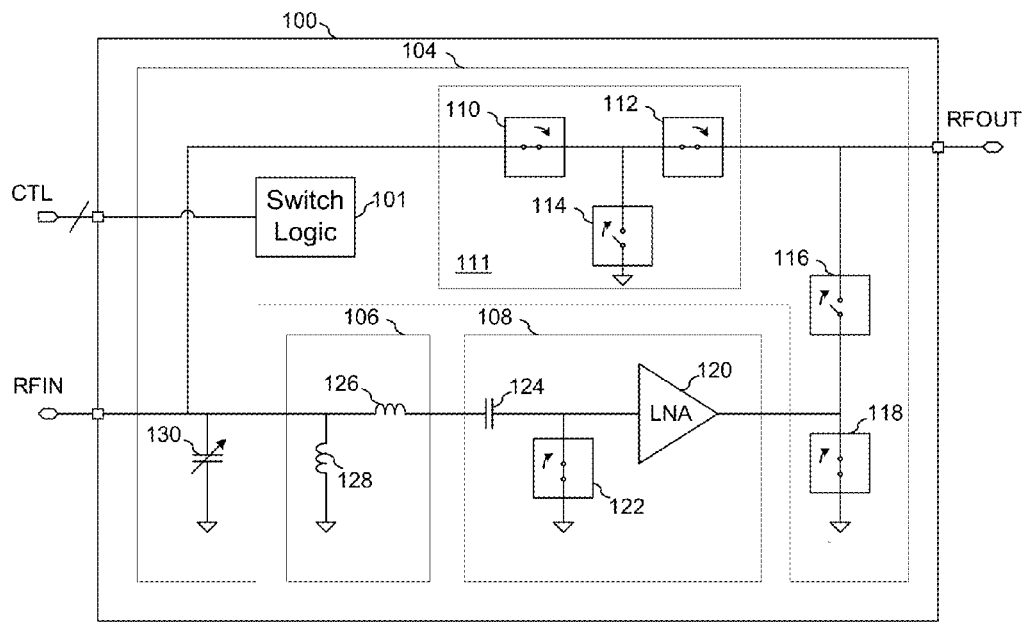

FIG. 1c illustrates LNA module 100 in a bypass mode in which LNA 120 is bypassed. As shown, switches 110 and 112 are closed and switch 114 is opened to allow a signal path between input terminal RFIN and output terminal RFOUT. In addition the signal path that includes LNA 120 is deactivated. In one embodiment, LNA is deactivated by closing switch 112 to ground the input of LNA 120. Alternatively, other methods known in the art may be used to deactivate and or disable LNA 120 in place of or in addition to switch 112. In the depicted embodiment, closing switch 112 further prevents LNA 120 from being activated by a strong RF signal at input terminal RFIN. Moreover, switch 122 connects inductor 126 and coupling capacitor 124 forming a series LC tank to ground. When coupling capacitor 124 has a large value, the resulting series LC tank presents an inductive impedance in the RF band. This inductive impedance is effectively connected in parallel with inductor 128 and may compensate the residual capacitance of adjustable capacitor 130 in some embodiments. Switch 118 shorts the output of LNA 120 to ground to prevent resonances due to the parasitic capacitance of open switch 116 in series with an inductive output impedance of LNA 120.

In embodiment, LNA module 100 is configured to operate at frequencies between about 700 MHz and about 2.7 GHz, however, in alternative embodiment LNA modules may be configured to operate outside of this frequency range. In some embodiments, LNA 120 may be shut off and/or placed in a low power mode when LNA module 100 is in the bypass mode. By shutting down LNA module 100 in bypass mode, power can be saved. For example, in some embodiments, LNA 120 may consume between about 2 mA and about 10 mA of current. However, in bypass mode, the various switches may consume about 60 μA in one example, thereby considerably reducing the amount of current consumed by LNA module 100 while in bypass mode. It should be understood, however, that in other embodiments, LNA 120 may consume currents outside of the range of 2 mA to 10 mA and the module may consume greater or less than 60 μA.

Figure 1D:
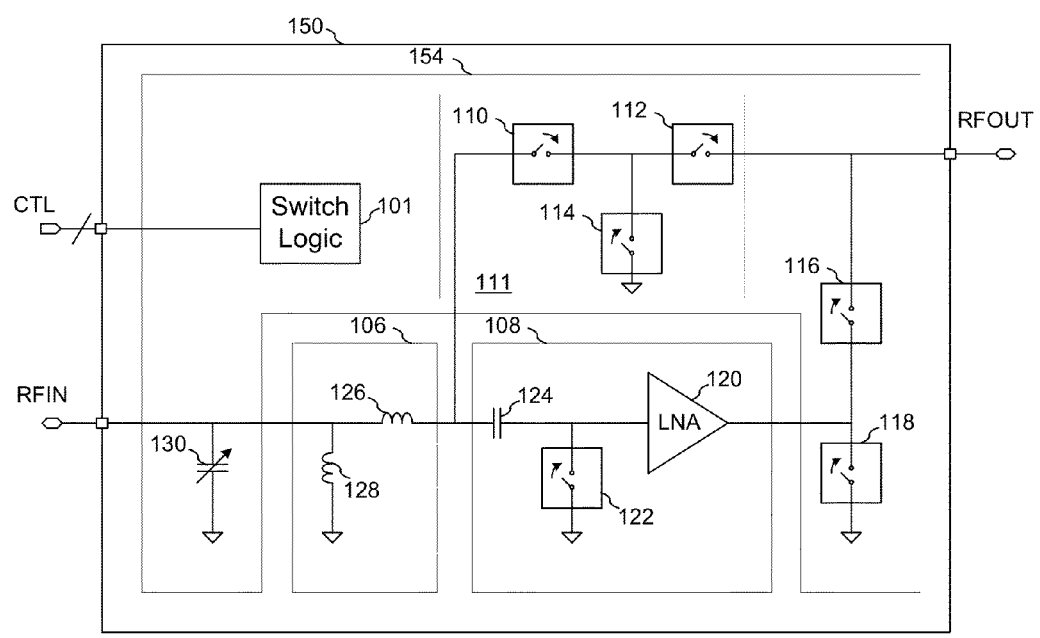

In an alternative embodiment, switch 110 may be coupled to input terminal RFIN via matching network 106, as shown in FIG. 1*d* that illustrates alternative embodiment LNA module 150 having tuning and switching network 154. As shown, switch 110 is coupled between matching network 106 and LNA circuit 108 instead of to input terminal RFIN as shown in the embodiment of FIG. 1*a*.

Figure 2A:
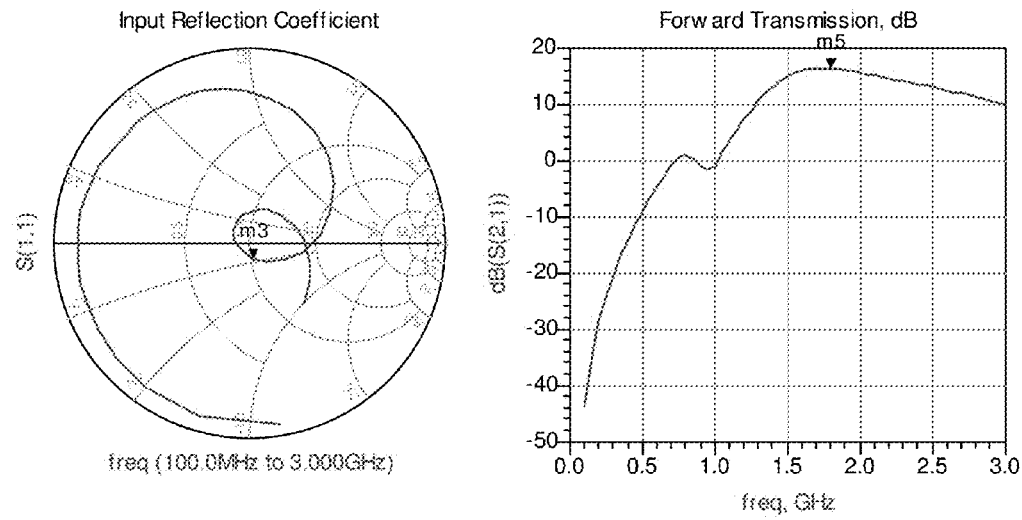
FIGS. 2a-2b illustrate plots of S parameters of an embodiment LNA module.

FIG. 2*a* illustrates a Smith chart showing input return loss S11 and a plot of forward transmission parameter S21 during the active mode in which the signal path including LNA 120 is selected with respect to embodiment LNA module 100 shown in FIG. 1*a*. As shown, S11 is close to being matched at a frequency of 1.8 GHz and has S21 shows a corresponding gain of about 16 dB at 1.8 GHz. In an embodiment, the quality of this match may be turned or adjusted by adjusting a value of adjustable capacitor 130 via control bus CTL.

Figure 2B:
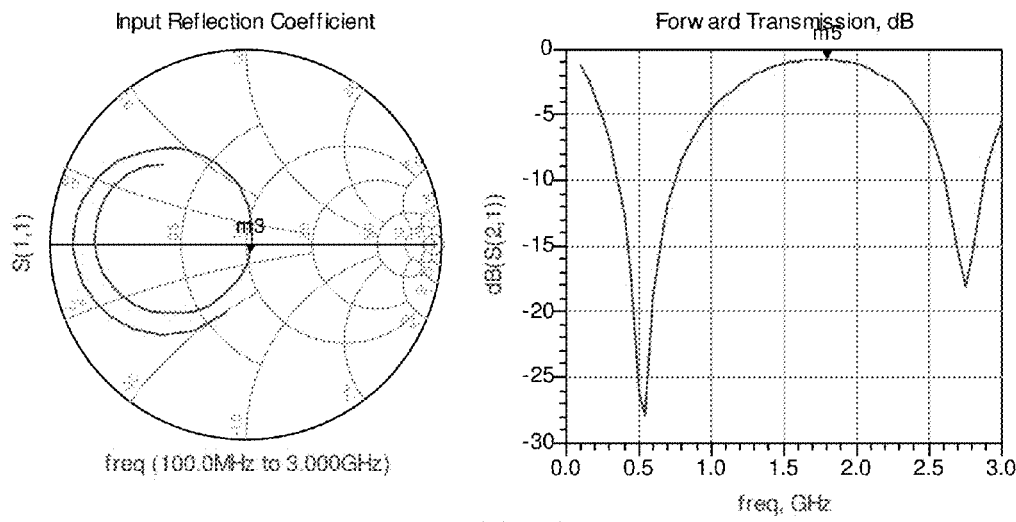

FIG. 2*b* illustrates a Smith chart showing input return loss S11 and a plot of forward transmission parameter S21 during the bypass mode in which the signal path including LNA 120 is deselected and the RF signal is routed from input terminal RFIN to output terminal RFOUT via switches 110 and 112. As shown, S11 is close to being matched at a frequency of 1.8 GHz and has S21 shows a corresponding gain of about −0.8 dB at 1.8 GHz. In an embodiment, the quality of this match may also be turned or adjusted by adjusting a value of adjustable capacitor 130 via control bus CTL. In some embodiments, adjustable capacitor 130 may be adjusted to have a different value in active mode than in bypass mode.

Figure 3A:
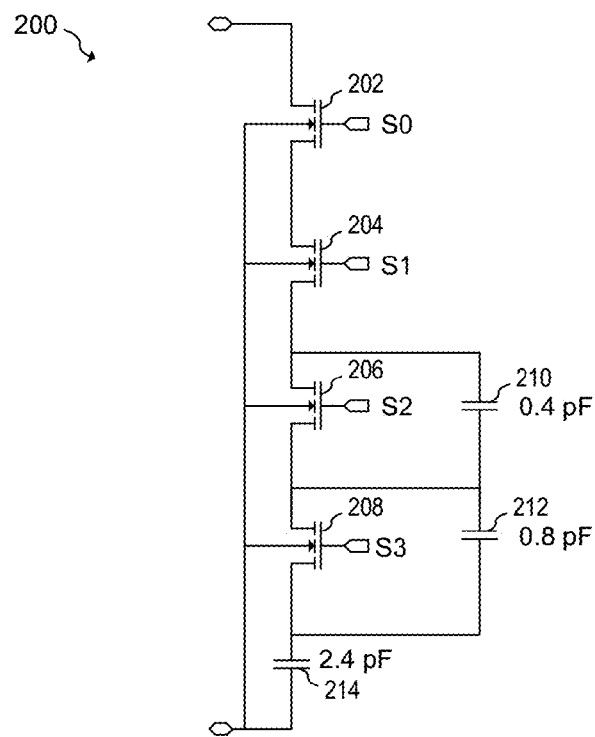
FIG. 3a-3b illustrate an embodiment adjustable capacitor and a corresponding plot of capacitance v. input code.

FIG. 3*a* illustrates adjustable capacitor 200 according to an embodiment of the present invention that may be used to implement adjustable capacitor 130. As shown, adjustable capacitor 200 includes switching transistors 202, 204, 206 and 208, as well as capacitors 210, 212 and 214. Switching transistors 202, 204, 206 and 208 may be implemented using NMOS transistors as shown, or by other device types, such as, but not limited to, PMOS, bipolar and pHEMT. The capacitance of adjustable capacitor 200 is selected by turning transistors 202, 204, 206 and 208 on and off in various combinations via control signals S0, S1, S2 and S3, respectively. In one specific embodiment, the minimum capacitance is about 0.2 pF as implemented by the parasitic capacitance of transistor 202 when it is off, and the maximum capacitance is about 2.5 pF as implemented by capacitor 214 in conjunction with the various parasitic capacitances of the other components in adjustable capacitor 200. In one embodiment, transistor 204 has a parasitic capacitance of about 0.4 pF, transistor 206 has a parasitic capacitance of about 0.4 pF, and transistor 208 has a parasitic capacitance about 0.5 pF. The values of capacitors 210, 212 and 214 are about 0.4 pF, 0.8 pF and 2.4 pF, respectively. It should be understood that the topology and corresponding values of adjustable capacitor 200 are just one example of many possible embodiment adjustable capacitors. In alternative embodiments of the present invention, other values and/or topologies may be used depending on the particular application and its specifications.

Figure 3B:
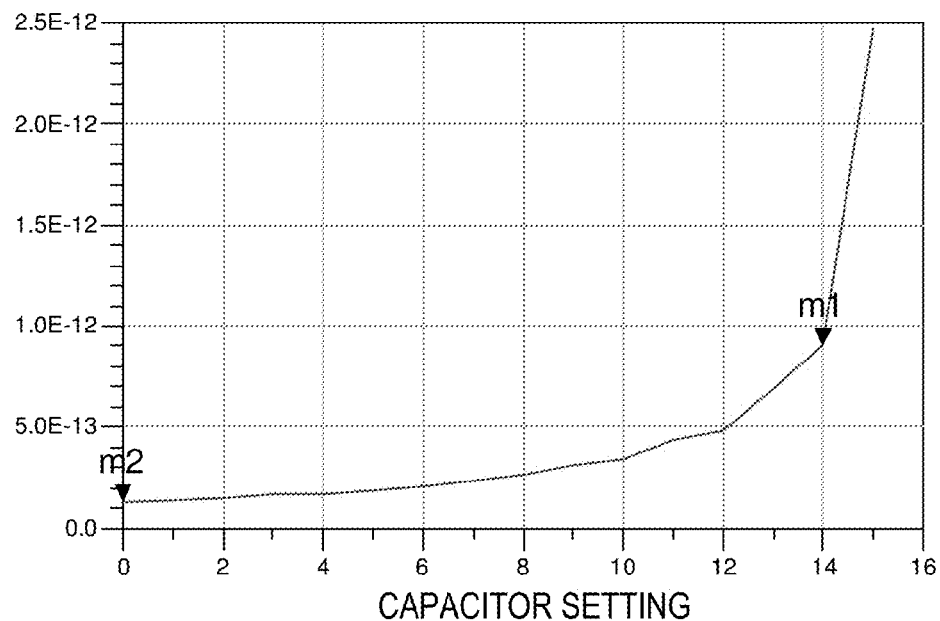

FIG. 3*b* illustrates a simulated plot of capacitance v. capacitance setting that corresponds to adjustable capacitor 200 shown in FIG. 3*a*. Each capacitance setting corresponds to a state of control signals S0, S1, S2 and S3. For example, in embodiments where S3 is the most significant bit (MSB) and S0 is the least significant bit (S0), such that a code of 0 corresponds to all signals S0, S1, S2 and S3 being low, a code of 15 corresponds to all signals S0, S1, S2 and S3 being high, and a code of 9 correspond to S0 and S3 being high and S1 and S2 being low. As shown, the total value of the capacitance of adjustable capacitor 200 ranges from about 0.3 pF at code 0 and about 2.5 pF at code 15. Code 14 corresponds to a capacitance of about 9 pF.

Figure 4:
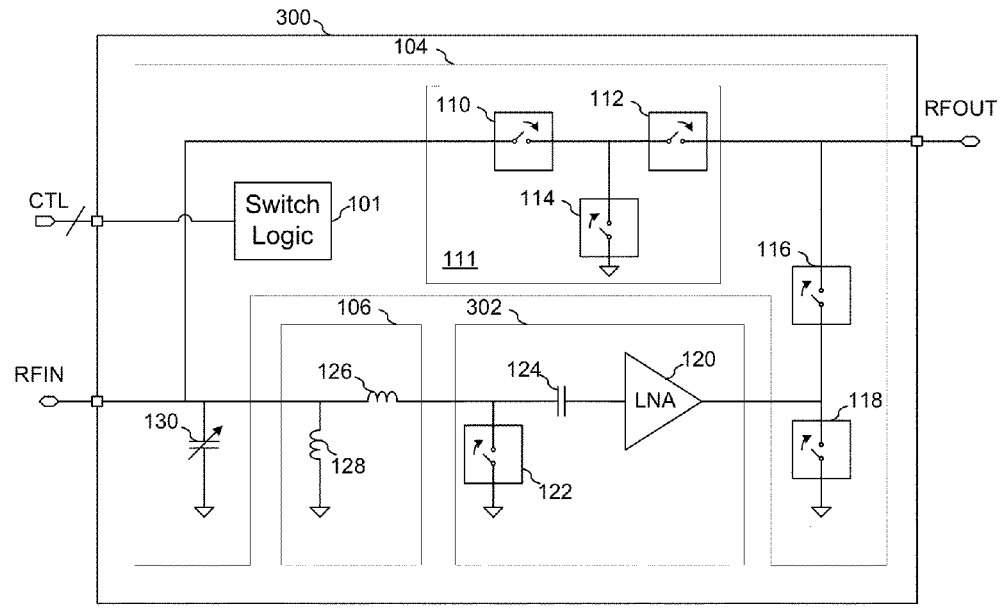
FIG. 4 illustrates another embodiment LNA module.

FIG. 4 illustrates LNA module 300 according to another embodiment of the present invention. LNA module 300 is similar to LNA module 100 shown in FIG. 1*a* with the exception of switch 122 within LNA circuit 302 being coupled to the input node of LNA 120 via coupling capacitor 124 instead of being coupled to same side of the coupling capacitor as LNA 120. In some embodiments, the placement of switch 122 and coupling capacitor 124 may improve the quality factor Q of the input match because coupling capacitor 124 is not in series with switch 122 in bypass mode.

Figure 5:
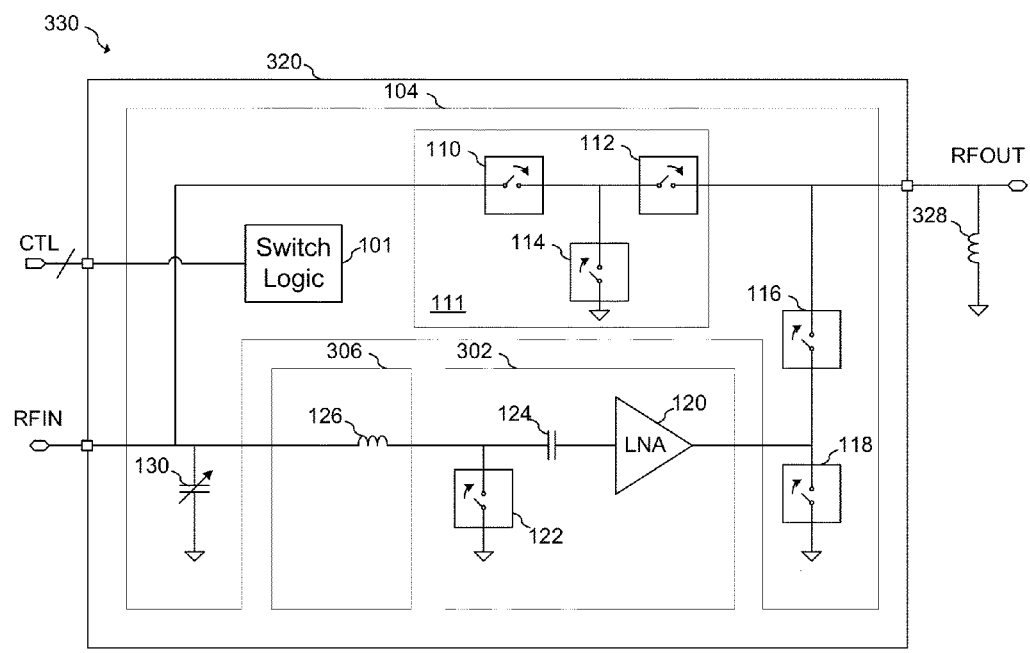
FIG. 5 illustrates a further embodiment LNA module.

FIG. 5 illustrates LNA system 330 that includes LNA module 320 according to a further embodiment of the present invention. LNA module 320 is similar to LNA module 300 except that shunt inductor 128 is removed from matching network 306, and a further shunt inductor 328 is coupled between output terminal RFOUT and ground. Here, adjustable capacitor 130 and inductor 126 are relied upon to provide an input match in active mode, and adjustable capacitor 130, inductor 126, and inductor 328 are relied upon to provide an input match in the bypass mode. In an embodiment, inductor 328 has an inductance between about 5 nH and about 18 nH. Alternatively, inductance values outside of this range may be used depending on the particular application and its specifications.

Figure 6:
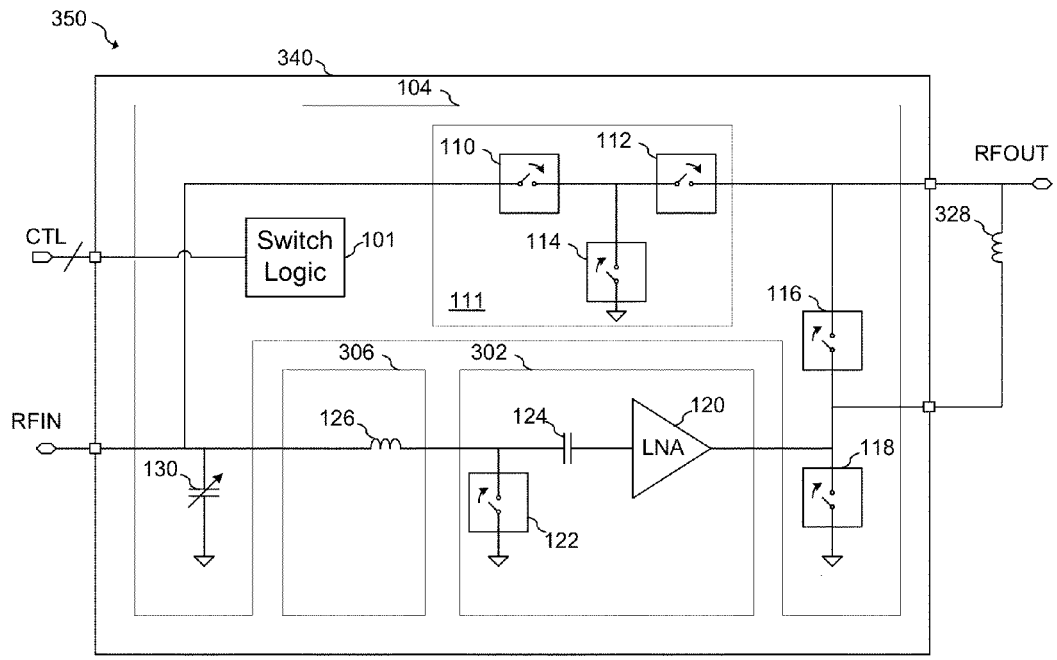
FIG. 6 illustrates an LNA module according to another embodiment.

FIG. 6 illustrates LNA system 350 that includes LNA module 340 according to a further embodiment of the present invention. LNA module 340 is similar to LNA module 330 with the addition of an extra output terminal connected to the output of LNA 120 such that shunt inductor 328 is coupled between output terminal RFOUT and the output of LNA 120. During bypass mode, switch 118 connects one end of inductor 328 to ground, while in active mode, switch 116 shorts out inductor 328.

Figure 7:
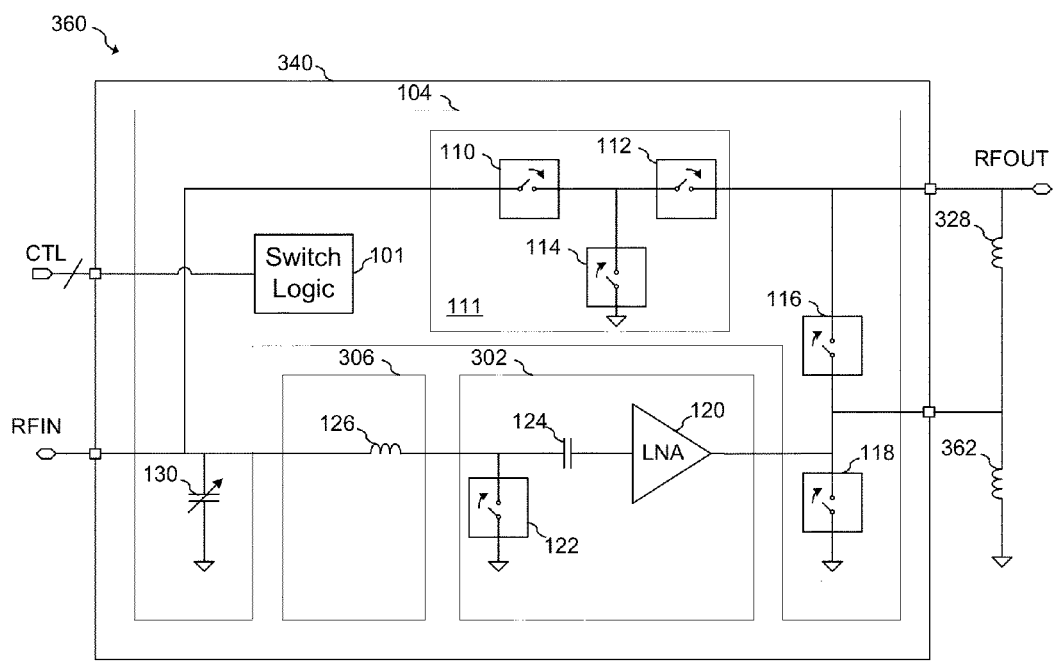
FIG. 7 illustrates an LNA module according to a further embodiment.

FIG. 7 illustrates LNA system 360 that includes LNA module 340 according to a further embodiment of the present invention. As shown, an additional inductor 362 is coupled between the output node of LNA 120 and ground. Accordingly, during active mode, switch 116 shorts out inductor 328 and inductor 362 is used by LNA 120 for output matching. During bypass mode, switch 118 shorts out inductor 362 and causes inductor 328 to be coupled between output terminal RFOUT and ground.

Figure 8:
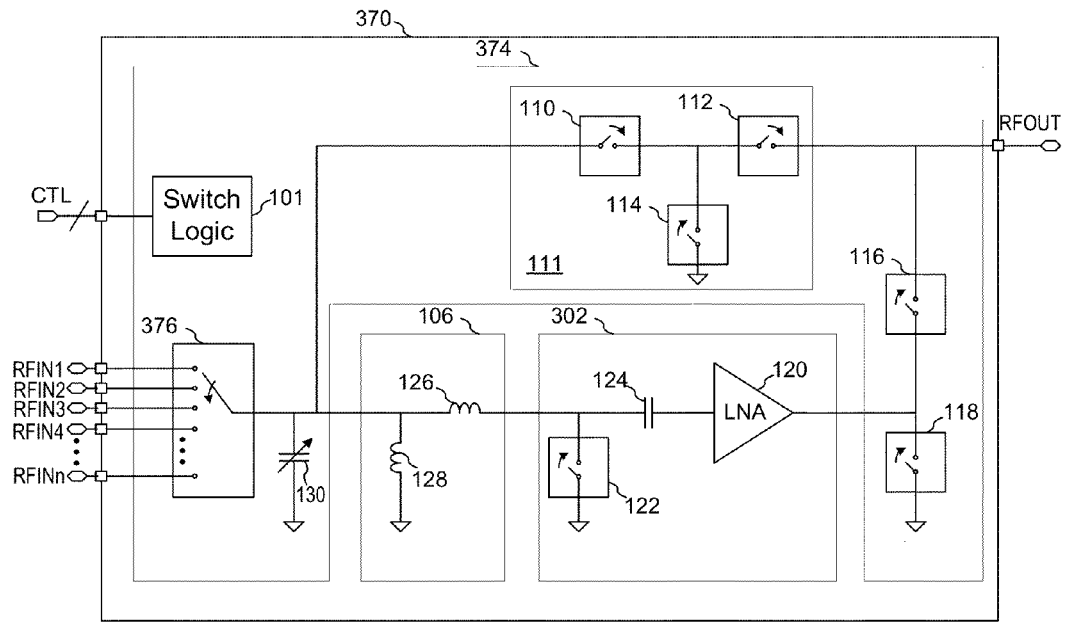
FIG. 8 illustrates an embodiment LNA module having an input selection switch.

FIG. 8 illustrates LNA module 370 according to another embodiment of the present invention. LNA module 374 is similar to LNA module 300 shown in FIG. 4 with the addition of selection switch 376 that selects between n input terminals RFIN1, RFIN2, RFIN3, and RFIN4 to RFINn. In an embodiment, the number of input terminals n selected by selection switch 376 may be any number 2 or greater. Selection switch 376 may implemented using RF selection switch architectures known in the art. In an embodiment, adjustable capacitor 130 may be tuned differently depending on which input terminal RFIN1, RFIN2, RFIN3, RFIN4 to RFINn is selected.

It should be understood that partitioning of the various LNA module blocks may be partitioned differently in alternative embodiments. For example, in one alternative embodiment, an LNA module may include selection switch 376, but use single series inductor matching network 306 shown in FIGS. 5-7 and/or use LNA circuit 108 in which switch 122 is connected to input terminal RFIN via coupling capacitor 124 (i.e., the positions of coupling capacitor 124 and switch 122 are reversed). Moreover, different combinations of embodiments may utilize additional external matching inductors as shown in FIGS. 5-7 along with various different matching networks, LNA circuits and selection switches.

Figure 9:
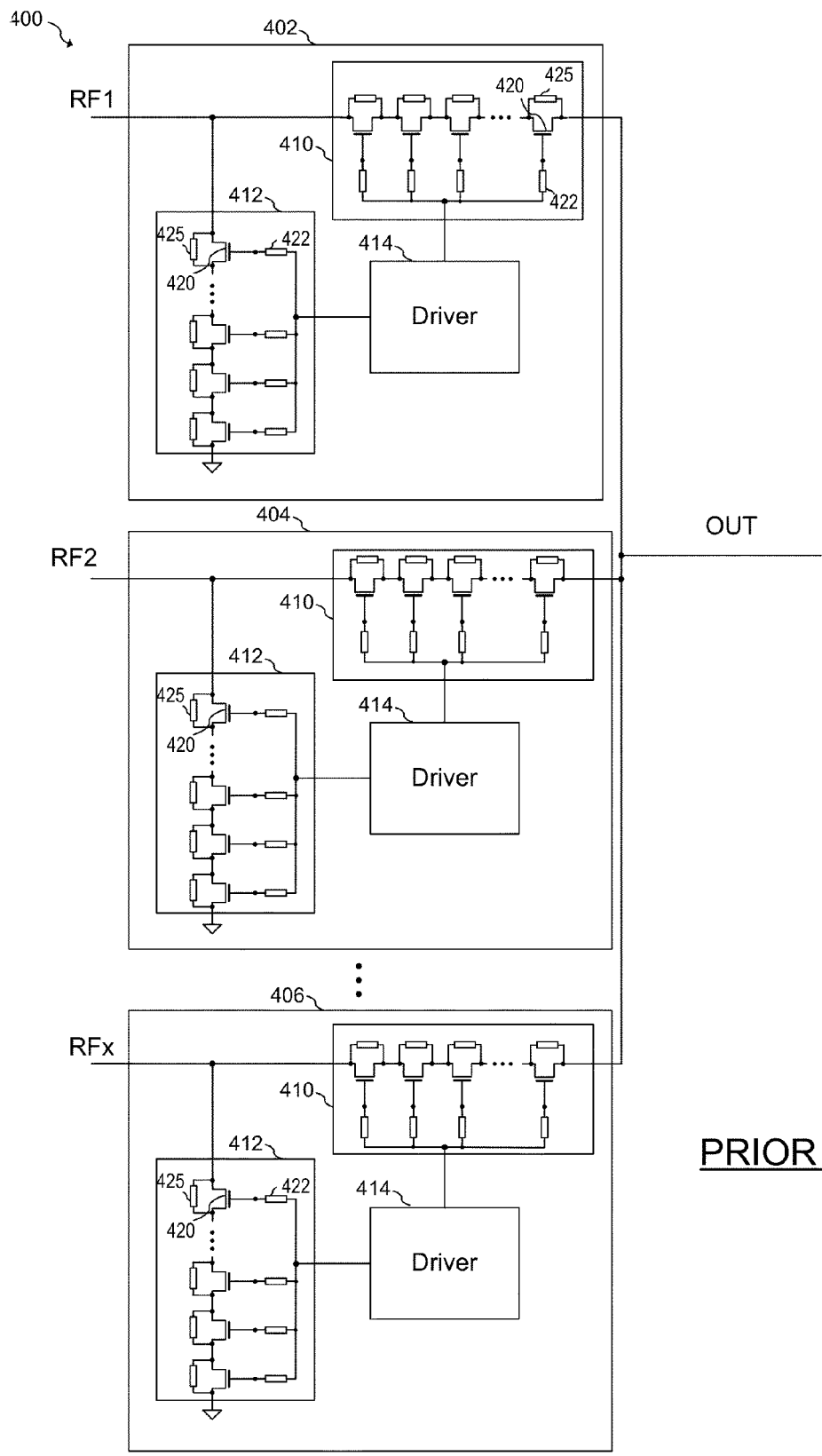
FIG. 9 illustrates an RF selection switch that may be utilized in embodiment LNA modules.

FIG. 9 illustrates conventional RF switch 400 that may be used to implement selection switch 376. As shown, each parallel RF switching network 402, 404 and 406 includes a series RF switch 410, a shunt RF switch 412 and a switch driver 414. During operation, a selected RF path is formed when driver 414 turns on series RF switch 410 and turns off shunt RF switch 412. Likewise, a RF path is deselected by turning off series RF switch 410 and turning on shunt RF switch 412. For example, input RF1 may be selected by activating RF switch 410 and deactivating RF switch 412 in RF switching network 402, while, at the same time, deactivating RF switch 410 and activating RF switch 412 in RF switching networks 404 and 406. Likewise, input RF2 may be selected by activating RF switch 410 and deactivating RF switch 412 in RF switching network 404, while, at the same time, deactivating RF switch 410 and activating RF switch 412 in RF switching networks 402 and 406.

Each RF switch 410 and 412 is implemented using a number of transistors 420 connected in series with each other. The source and drain of each transistor 420 is biased using resistor 425, and the gate is each transistor 420 has a series gate resistor 422. As shown, transistors 420 are stacked in order to withstand high voltages. The number of stacked transistors may vary according to the particular semiconductor technology used and the expected operating environment. It should be understood that RF switch 400 is one of many example selection switches that may be used to implement selection switch 376.

Figure 10:
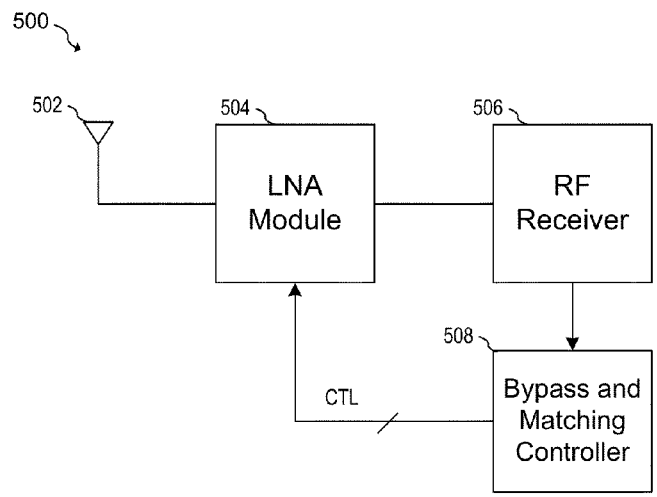
FIG. 10 illustrates an embodiment RF system.

FIG. 10 illustrates RF system 500 according to an embodiment of the present invention. As shown, RF system 500 includes antenna 502 coupled to RF receiver 506 via embodiment LNA module 504, which may be implemented at least according to any of the embodiments described herein. Bypass and matching controller 508 is configured to provide mode selection and adjustable capacitance selection data to LNA module 504 based on input from RF receiver 506 or other controller. For example, when RF receiver 506 detects that the input signal from antenna 502 is at a high level, it may instruct bypass and matching controller 508 to select the bypass mode. In addition, 508 may also select appropriate settings for adjustable capacitor 130 in the various modes, for example, in order to optimize the match between antenna 502 and RF receiver 506. In some embodiments, the selection setting for adjustable capacitor 130 may be stored in a memory on LNA module 504.

Figure 11:
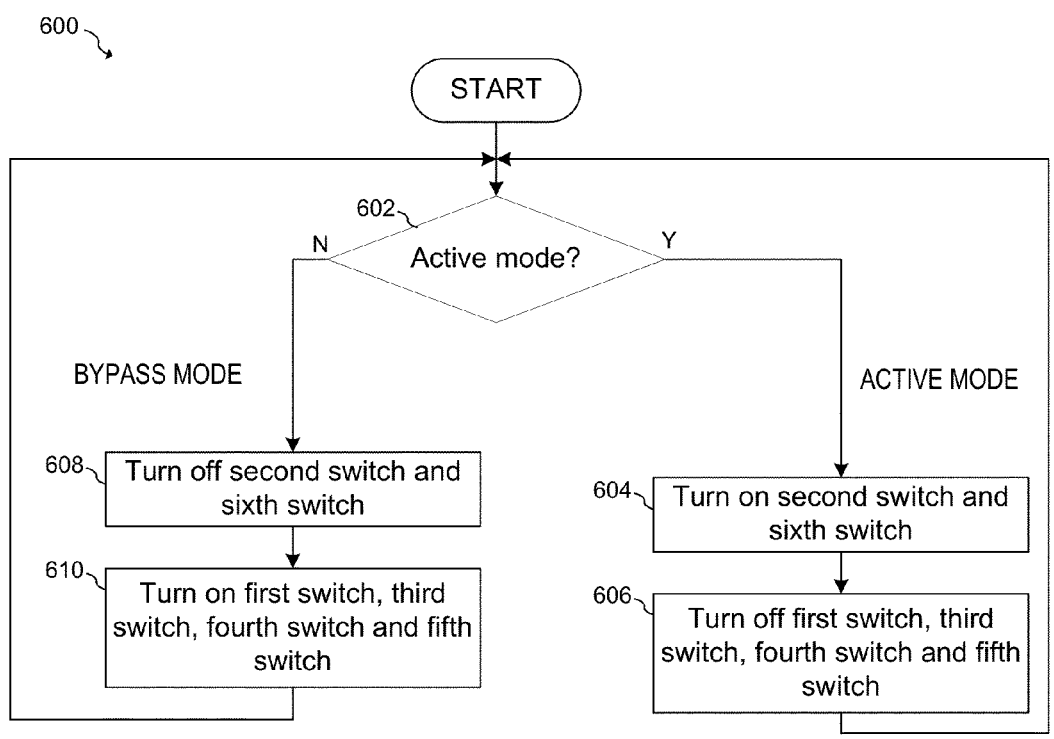
FIG. 11 illustrates a flowchart of an embodiment method.

FIG. 11 illustrates a flowchart of embodiment method 600 directed toward the operation of an LNA module that includes a first signal path coupled between an input port and an output port and second signal path coupled in parallel with the first signal path. The first signal path includes a low noise amplifier (LNA) coupled having an input node coupled to the input port via a coupling capacitor, a first switch having a first load path terminal coupled to the input node of the LNA and a second load path terminal coupled to a first reference node, a second switch coupled in between an output node of the LNA and the output port, and a third switch coupled between the output node of the LNA and the first reference node. The second signal path includes a fourth switch coupled between the input port and a first intermediate node, a fifth switch coupled between the first intermediate node and the output port, and a sixth switch coupled between the first intermediate node and the first reference node.

In step 602 of the method, a determination is made whether the LNA module is to be operated in an active mode with the LNA active, or in a bypass mode. If it is determined that the LNA module is to be operated in an active mode, the second and sixth switches are turned on in step 604 and the first, third, fourth and fifth switches are turned off in step 606. On the other hand, if it is determined that the LNA module is to be operated in the bypass mode, the second and sixth switches are turned off in step 608 and the first, third, fourth and fifth switches are turned on in step 610.

In accordance with an embodiment, a circuit includes a first signal path coupled between an input port and an output port, and a second path coupled between the input port and the output port in parallel with the first signal path. The first signal path includes a low noise amplifier (LNA) having an input node coupled to the input port, a first switch having a first load path terminal coupled to the input node of the LNA and a second load path terminal coupled to a first reference node. The second signal path includes a second switch coupled between the input port and a first intermediate node, a third switch coupled between the first intermediate node and the output port, and a fourth switch coupled between the first intermediate node and the first reference node. The first reference node may be a ground node and/or the circuit may further include a single pole multi throw (SPMT) switch coupling a plurality of input terminals to the input port.

The circuit may further include a control circuit configured to operate the circuit in an active mode by activating the first signal path and deactivate the second signal path by turning on the fourth switch and turning off the first switch, the second switch and the third switch. The control may further operate the circuit in a bypass mode by activating the second signal path by deactivating the first signal path by turning off the fourth switch and turning on the first switch, the second switch and the third switch. In an embodiment, the circuit further includes a fifth switch coupled between an output node of the LNA and the output port and/or a sixth switch coupled between the output node of the LNA and the first reference node. Accordingly, the control circuit may be further configured to in the active mode, activate the first signal path and deactivate the second signal path by turning on the fourth switch and the fifth switch and turning off the first switch, the second switch, the third switch and the sixth switch, and in the bypass mode, activate the second signal path and deactivate the first signal path by turning off the fourth switch and the fifth switch and turning on the first switch, the second switch, the third switch and the sixth switch.

In an embodiment, a coupling capacitor is coupled between the first load path terminal of the first switch and the input node of the LNA. In some embodiments, the first load path terminal of the first switch is coupled to the input port via a coupling capacitor.

In an embodiment, the circuit further includes a matching network coupled between the input port and the input node of the LNA. The circuit may further include an adjustable capacitor coupled to the input node. This adjustable capacitor may include a first capacitor, a plurality of switches coupled in series with the first capacitor and a capacitor coupled in parallel with one of the plurality of switches. The matching network may include a series inductor and/or a shunt inductor coupled to the input port. In some embodiments, the circuit may include a shunt inductor coupled to the output port and/or a first inductor coupled in parallel with the second switch. A second inductor coupled between the output node of the LNA and the first reference node may also be included.

In an embodiment, the matching network may include an input node coupled to the input port and an output node coupled to the second switch and to the input node of the LNA. Alternatively, the matching network may include an input node coupled to the input port and to the second switch, and an output node coupled to the input node of the LNA.

In accordance with a further embodiment, a circuit includes a first signal path coupled between an input port and an output port and second signal path coupled in parallel with the first signal path. The first signal path includes a low noise amplifier (LNA) having an input node coupled to the input port, and a first switch having a first load path terminal coupled to the input node of the LNA. The second signal path includes a second switch coupled between the input port and a first intermediate node, a third switch coupled between the first intermediate node and the output port, and a fourth switch coupled between the first intermediate node and a first reference node. A method of operating this circuit includes operating the circuit in an active mode by activating the first signal path and deactivating the second signal path by turning on the fourth switch and turning off the first switch, the second switch and the third switch. The method further includes operating the circuit in a bypass mode by activating the second signal path and deactivating the first signal path by turning off the fourth switch and turning on the first switch, the second switch and the third switch. The method may further include tuning a matching network coupled to the input port, tuning comprising adjusting a variable capacitor coupled to the input port.

In an embodiment, the method may also include routing one of a plurality of input nodes to the input port, routing comprising selecting the one of the plurality of input nodes using a single pole multi throw (SPMT) switch. Also included in the method may be tuning a matching network coupled to the input port according to the selected one of the plurality of input nodes.

In an embodiment, the circuit further includes a fifth switch coupled in between an output node of the LNA and the output port, and the method further includes operating the circuit in the active mode further comprises turning on the fifth switch. Operating the circuit in the bypass mode may further include turning off the fifth switch. In an embodiment, the circuit may also include a sixth switch coupled between the output node of the LNA and the first reference node, and the method may include operating the circuit in the active mode further comprises turning off the sixth switch. Operating the circuit in the bypass mode may also include turning on the sixth switch.

In accordance with an embodiment, a module includes a low noise amplifier (LNA) integrated circuit having an amplifier, a coupling capacitor coupled between an input node of the amplifier and an input terminal of the LNA integrated circuit, and a first switch coupled between the input node of the LNA and a reference node terminal. The module also includes a switching network integrated circuit having a switching network input terminal coupled to a module input terminal, a switching network output terminal coupled to a module output terminal, a signal path terminal coupled to an output terminal of the LNA integrated circuit, a second switch coupled between the signal path terminal and the output terminal, a third switch coupled between the signal path terminal and the reference node terminal, a fourth switch coupled between the input terminal and an intermediate node, a fifth switch coupled between the intermediate terminal and the switching network output terminal, a sixth switch coupled between the intermediate node and the reference node terminal, and an adjustable capacitor coupled between the switching network input terminal and the reference node terminal. The module also includes a matching network coupled between the module input terminal and the input terminal of the LNA integrated circuit.

In an embodiment, the module may also include a control circuit configured to turn on the second switch and the sixth switch and turn off the first switch, the third switch, the fourth switch and the fifth switch in an active mode, and turn off the second switch and the sixth switch and turn on the first switch, the third switch, the fourth switch and the fifth switch in a bypass mode.

The module may further include a matching network coupled between the input terminal of the LNA integrated circuit and the input terminal of the module. In an embodiment, the module input terminal includes a plurality of module input terminals, and the switching network integrated circuit further includes a single pole multi throw (SPMT) switch coupling the plurality of module input terminals to the switching network input terminal. The coupling capacitor may be coupled between a first load path terminal of the first switch and the input terminal of the LNA integrated circuit.

In accordance with a further embodiment, a circuit includes a first signal path coupled between an input port and an output port. The first signal path includes a matching network having an input node coupled to the input port, a low noise amplifier (LNA) having an input node coupled to an output node of the matching network and an output coupled to the output port. The circuit further includes a second signal path coupled between the input port and the output port in parallel with the first signal path, and the second signal path includes a bypass switch.

In an embodiment, the circuit further includes a control circuit configured to, in an active mode, activate the first signal path and deactivate the second signal path by turning off the bypass switch and deactivating the LNA, and, in a bypass mode, activate the second signal path and deactivate the first signal path by turning on the bypass switch and activating the LNA.

The circuit may further include a first switch coupled between the input node of the LNA and a first reference node, such that deactivating the LNA comprises turning on the first switch and activating the LNA comprises turning off the first switch.

In an embodiment, a coupling capacitor is coupled between a first load path terminal of the first switch and the input node of the LNA. Alternatively, a first load path terminal of the first switch is coupled to the input port via a coupling capacitor.

In an embodiment, the bypass switch includes a second switch having a first load path terminal coupled to the input port and a second load path terminal coupled to an intermediate node, a third switch having a first load path terminal coupled to the intermediate node and a second load path terminal coupled to the output port, and a fourth switch coupled between the intermediate node and a first reference node. The circuit may also include a fifth switch coupled in between an output node of the LNA and the output port and/or a sixth switch coupled between the output node of the LNA and a first reference node. In an embodiment, deactivating the LNA includes turning off the fifth switch and turning on the sixth switch, and activating the LNA comprises turning on the fifth switch and turning off the sixth switch. In some embodiments, the circuit further includes an adjustable capacitor coupled to the input node.

In accordance with a further embodiment, a first signal path is coupled between an input port and an output port. The first signal path includes a low noise amplifier (LNA) having an input node coupled to the input port and a first switch coupled between an output node of the LNA and the output port. The circuit further includes a second signal path coupled between the input port and the output port in parallel with the first signal path, such that the second signal path includes a second switch coupled between the input port and a first intermediate node, a third switch coupled between the first intermediate node and the output port, and a fourth switch coupled between the first intermediate node and a first reference node. The circuit may further include a fifth switch coupled between the output node of the LNA and a first reference node.

In accordance with a further embodiment, a circuit includes a first signal path coupled between an input port and an output port. The first signal path includes a low noise amplifier (LNA) having an input node coupled to the input port, a second signal path coupled between the input port and the output port in parallel with the first signal path. The circuit further includes a second signal path coupled between the input port and the output port in parallel with the first signal path, such that the second signal path includes a first switch coupled between the input port and a first intermediate node, a second switch coupled between the first intermediate node and the output port, and a third switch coupled between the first intermediate node and a first reference node. The circuit further includes a logic circuit having outputs couples to control nodes of the first switch, the second switch and the third switch. The logic circuit is configured to turn on the first switch and the second switch, and turn off the third switch in a bypass mode, and turn off the first switch and the second switch and turn on the third switch in an active mode.

In an embodiment, the circuit further includes a digital bus interface circuit coupled to the logic circuit. The digital bus interface circuit is configured to determine whether the circuit operates in the active mode or in the bypass mode based on a digital control signal received by the digital bus interface circuit.

Advantages of some embodiment LNA modules include the ability to bypass an LNA in when an input RF signal has a high amplitude. In such a situation, bypassing the LNA may save current. A further advantage of some embodiments that include a "T" bypass switch that reduces and/or eliminates a parasitic feedback path is the ability to provide a circuit capable of bypassing a LNA while maintaining stable operation in the active mode. In embodiments, in which no switches are coupled in series with the input of the LNA, better noise performance is achieved because attenuation caused the resistance of such series switches does not degrade the noise performance of the system. A further advantage of some embodiments include better linearity.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A circuit comprising:
 a first signal path coupled between an input port and an output port, the first signal path comprising:
  a matching network having an input node coupled to the input port,
  a low noise amplifier (LNA) having an input node coupled to an output node of the matching network, and
  a first switch having a first load path terminal coupled to the input node of the LNA and a second load path terminal coupled to a first reference node; and
 a second signal path coupled between the input port and the output port in parallel with the first signal path, the second signal path comprising:
  a second switch coupled between the input port and a first intermediate node,
  a third switch coupled between the first intermediate node and the output port, and
  a fourth switch coupled between the first intermediate node and the first reference node, wherein the second signal path is configured to bypass the matching network, the LNA and the first switch via the second switch and the third switch.

2. The circuit of claim 1, further comprising a control circuit configured to:
 in an active mode, activate the first signal path and deactivate the second signal path by turning on the fourth switch and turning off the first switch, the second switch and the third switch; and
 in a bypass mode, activate the second signal path and deactivate the first signal path by turning off the fourth switch and turning on the first switch, the second switch and the third switch.

3. The circuit of claim 1, further comprising a fifth switch coupled between an output node of the LNA and the output port, wherein the second signal path is further configured to bypass the fifth switch.

4. The circuit of claim 3, further comprising a sixth switch coupled between the output node of the LNA and the first reference node.

5. The circuit of claim 4, further comprising a control circuit configured to:
 in an active mode, activate the first signal path and deactivate the second signal path by turning on the fourth switch and the fifth switch and turning off the first switch, the second switch, the third switch and the sixth switch; and
 in a bypass mode, activate the second signal path and deactivate the first signal path by turning off the fourth switch and the fifth switch and turning on the first switch, the second switch, the third switch and the sixth switch.

6. The circuit of claim 1, wherein a coupling capacitor is coupled between the first load path terminal of the first switch and the input node of the LNA.

7. The circuit of claim 1, wherein the first load path terminal of the first switch is coupled to the input port via a coupling capacitor.

8. The circuit of claim 1, further comprising an adjustable capacitor coupled to the input node.

9. The circuit of claim 8, wherein the adjustable capacitor comprises:
 a first capacitor;
 a plurality of switches coupled in series with the first capacitor; and a second capacitor coupled in parallel with one of the plurality of switches.

10. The circuit of claim 1, wherein the matching network comprises a series inductor.

11. The circuit of claim 10, wherein the matching network further comprises a shunt inductor coupled to the input port.

12. The circuit of claim 10, further comprising a shunt inductor coupled to the output port.

13. The circuit of claim 3, further comprising a first inductor coupled in parallel with the fifth switch.

14. The circuit of claim 13, further comprising a second inductor coupled between the output node of the LNA and the first reference node.

15. The circuit of claim 1, wherein the first reference node is a ground node.

16. The circuit of claim 1, further comprising a single pole multi throw (SPMT) switch coupling a plurality of input terminals to the input port.

17. A method of operating a circuit comprising a first signal path coupled between an input port and an output port and second signal path coupled in parallel with the first signal path, the first signal path comprising a low noise amplifier (LNA) having an input node coupled to the input port, a matching network coupled between the input port and the input node of the LNA, and a first switch having a first load path terminal coupled to the input node of the LNA, the second signal path comprising a second switch coupled between the input port and a first intermediate node, a third switch coupled between the first intermediate node and the output port, and a fourth switch coupled between the first intermediate node and a first reference node, the method comprising:
  operating the circuit in an active mode comprising activating the first signal path and deactivating the second signal path by turning on the fourth switch and turning off the first switch, the second switch and the third switch; and
  operating the circuit in a bypass mode comprising activating the second signal path and deactivating the first signal path by turning off the fourth switch and turning on the first switch, the second switch and the third switch, wherein the second signal path bypasses the matching network, LNA and the first switch via the second switch and the third switch in the bypass mode.

18. The method of claim 17, further comprising tuning the matching network coupled to the input port, tuning comprising adjusting a variable capacitor coupled to the input port.

19. The method of claim 18, further comprising routing one of a plurality of input nodes to the input port, routing comprising selecting the one of the plurality of input nodes using a single pole multi throw (SPMT) switch.

20. The method of claim 19, further comprising tuning a matching network coupled to the input port according to the selected one of the plurality of input nodes.

21. The method of claim 17, wherein:
  the circuit further comprises a fifth switch coupled in between an output node of the LNA and the output port;
  operating the circuit in the active mode further comprises turning on the fifth switch; and
  operating the circuit in the bypass mode further comprises turning off the fifth switch.

22. The method of claim 21, wherein:
  the circuit further comprises a sixth switch coupled between the output node of the LNA and the first reference node;
  operating the circuit in the active mode further comprises turning off the sixth switch; and
  operating the circuit in the bypass mode further comprises turning on the sixth switch.

23. A module comprising:
  a low noise amplifier (LNA) integrated circuit comprising an amplifier, a coupling capacitor coupled between an input node of the amplifier and an input terminal of the LNA integrated circuit, and a first switch coupled between the input node of the LNA and a reference node terminal;
  a switching network integrated circuit comprising
    a switching network input terminal coupled to a module input terminal,
    a switching network output terminal coupled to a module output terminal,
    a signal path terminal coupled to an output terminal of the LNA integrated circuit,
    a second switch coupled between the signal path terminal and the switching network output terminal,
    a third switch coupled between the signal path terminal and the reference node terminal,
    a fourth switch coupled between the input terminal and an intermediate node,
    a fifth switch coupled between the intermediate node and the switching network output terminal,
    a sixth switch coupled between the intermediate node and the reference node terminal, and
    an adjustable capacitor coupled between the switching network input terminal and the reference node terminal; and
  a matching network coupled between the module input terminal and the input terminal of the LNA integrated circuit.

24. The module of claim 23, further comprising a control circuit configured to:
  in an active mode, turn on the second switch and the sixth switch and turn off the first switch, the third switch, the fourth switch and the fifth switch; and
  in a bypass mode, turn off the second switch and the sixth switch and turn on the first switch, the third switch, the fourth switch and the fifth switch.

25. The module of claim 23, wherein:
  the module input terminal comprises a plurality of module input terminals; and
  the switching network integrated circuit further comprises a single pole multi throw (SPMT) switch coupling the plurality of module input terminals to the switching network input terminal.

26. The module of claim 25, wherein the coupling capacitor is coupled between a first load path terminal of the first switch and the input terminal of the LNA integrated circuit.

27. A circuit comprising:
  a first signal path coupled between an input port and an output port, the first signal path comprising
    a matching network having an input node coupled to the input port,
    a low noise amplifier (LNA) having an input node coupled to an output node of the matching network and an output coupled to the output port,
    a first switch coupled between the input node of the LNA and a first reference node; and
  a second signal path coupled between the input node of the matching network and the output port in parallel with the first signal path, the second signal path comprising a bypass switch configured to bypass the matching network and the LNA.

28. The circuit of claim 27, further comprising a control circuit configured to:
in an active mode, activate the first signal path and deactivate the second signal path by turning off the bypass switch and activating the LNA; and
in a bypass mode, activate the second signal path and deactivate the first signal path by turning on the bypass switch and deactivating the LNA.

29. The circuit of claim 28, wherein deactivating the LNA comprises turning on the first switch and activating the LNA comprises turning off the first switch.

30. The circuit of claim 29, further comprising a coupling capacitor coupled between a first load path terminal of the first switch and the input node of the LNA.

31. The circuit of claim 29, further comprising a coupling capacitor coupled between a first load path terminal of the first switch and the matching network and the input port.

32. The circuit of claim 27, wherein the bypass switch comprises:
a second switch having a first load path terminal coupled to the input port and a second load path terminal coupled to an intermediate node;
a third switch having a first load path terminal coupled to the intermediate node and a second load path terminal coupled to the output port; and
a fourth switch coupled between the intermediate node and a first reference node.

33. The circuit of claim 27, further comprising a fifth switch coupled in between an output node of the LNA and the output port.

34. The circuit of claim 33, further comprising a sixth switch coupled between the output node of the LNA and a first reference node.

35. The circuit of claim 34, wherein deactivating the LNA comprises turning off the fifth switch and turning on the sixth switch, and activating the LNA comprises turning on the fifth switch and turning off the sixth switch.

36. The circuit of claim 27, further comprising an adjustable capacitor coupled to the input node.

37. A circuit comprising:
a first signal path coupled between an input port and an output port, the first signal path comprising
a low noise amplifier (LNA) having an input node coupled to the input port, and
a first switch coupled between an output node of the LNA and the output port; and
a second signal path coupled between the input port and the output port in parallel with the first signal path, the second signal path comprising
a second switch coupled between the input port and a first intermediate node,
a third switch coupled between the first intermediate node and the output port, and
a fourth switch coupled between the first intermediate node and a first reference node, wherein the second signal path is configured to bypass the LNA and the first switch via the second switch and the third switch.

38. The circuit of claim 37, further comprising a fifth switch coupled between the output node of the LNA and a first reference node.

39. A circuit comprising:
a first signal path coupled between an input port and an output port, the first signal path comprising a low noise amplifier (LNA) having an input node coupled to the input port;
a second signal path coupled between the input port and the output port in parallel with the first signal path, the second signal path comprising
a first switch coupled between the input port and a first intermediate node,
a second switch coupled between the first intermediate node and the output port, and
a third switch coupled between the first intermediate node and a first reference node; and
a logic circuit having outputs coupled to control nodes of the first switch, the second switch and the third switch, the logic circuit configured to
turn on the first switch and the second switch, and turn off the third switch in a bypass mode, and
turn off the first switch and the second switch and turn on the third switch in an active mode; and
a digital bus interface circuit coupled to the logic circuit, the digital bus interface circuit configured to determine whether the circuit operates in the active mode or in the bypass mode based on a digital control signal received by the digital bus interface circuit.

40. The circuit of claim 1, wherein an inductive impedance is formed at the input node of the matching network at an operating frequency of the LNA when the first switch is closed.

41. The circuit of claim 40, wherein the inductive impedance compensates a capacitance at the input port when the first switch is closed.

42. The circuit of claim 41, wherein the matching network comprises a series inductor.

43. The circuit of claim 40, further comprising further comprising an adjustable capacitor coupled to the input node, wherein the inductive impedance compensates a residual capacitance of the adjustable capacitor when the first switch is closed.

44. The module of claim 23, wherein an inductive impedance is formed at the input node of the matching network at an operating frequency of the LNA when the first switch is closed.

45. The module of claim 44, wherein the matching network comprises a series inductor.

46. The module of claim 45, wherein the inductive impedance compensates a residual capacitance of the adjustable capacitor when the first switch is closed.

47. The module of claim 23, wherein:
the LNA integrated circuit is fabricated in a Bipolar process; and
the switching network integrated circuit is fabricated in a CMOS process.

48. The circuit of claim 27, wherein an inductive impedance is formed at the input node of the matching network at an operating frequency of the LNA when the first switch is closed.

49. The circuit of claim 48, wherein the inductive impedance compensates a capacitance at the input port when the first switch is closed.

50. The circuit of claim 49, wherein the matching network comprises a series inductor.

51. The circuit of claim 49, further comprising further comprising an adjustable capacitor coupled to the input node, wherein the inductive impedance compensates a residual capacitance of the adjustable capacitor when the first switch is closed.

52. A circuit comprising:
a first signal path coupled between an input port and an output port, the first signal path comprising:
a low noise amplifier (LNA) having an input node coupled to the input port, and
a first switch having a first load path terminal coupled to the input node of the LNA and a second load path terminal coupled to a first reference node;
a second signal path coupled between the input port and the output port in parallel with the first signal path, the second signal path comprising:
a second switch coupled between the input port and a first intermediate node,
a third switch coupled between the first intermediate node and the output port, and
a fourth switch coupled between the first intermediate node and the first reference node; and
an adjustable capacitor coupled to the input node, wherein the adjustable capacitor comprises a first capacitor, a plurality of switches coupled in series with the first capacitor, and a second capacitor coupled in parallel with one of the plurality of switches.

53. A circuit comprising:
a first signal path coupled between an input port and an output port, the first signal path comprising:
a low noise amplifier (LNA) having an input node coupled to the input port,
a first switch having a first load path terminal coupled to the input node of the LNA and a second load path terminal coupled to a first reference node;
a second signal path coupled between the input port and the output port in parallel with the first signal path, the second signal path comprising:
a second switch coupled between the input port and a first intermediate node,
a third switch coupled between the first intermediate node and the output port, and
a fourth switch coupled between the first intermediate node and the first reference node; and
a single pole multi throw (SPMT) switch coupling a plurality of input terminals to the input port.

54. A method of operating a circuit comprising a first signal path coupled between an input port and an output port and second signal path coupled in parallel with the first signal path, the first signal path comprising a low noise amplifier (LNA) having an input node coupled to the input port, and a first switch having a first load path terminal coupled to the input node of the LNA, the second signal path comprising a second switch coupled between the input port and a first intermediate node, a third switch coupled between the first intermediate node and the output port, and a fourth switch coupled between the first intermediate node and a first reference node, the method comprising:
operating the circuit in an active mode comprising activating the first signal path and deactivating the second signal path by turning on the fourth switch and turning off the first switch, the second switch and the third switch;
operating the circuit in a bypass mode comprising activating the second signal path and deactivating the first signal path by turning off the fourth switch and turning on the first switch, the second switch and the third switch;
tuning a matching network coupled to the input port, tuning comprising adjusting a variable capacitor coupled to the input port; and
routing one of a plurality of input nodes to the input port, routing comprising selecting the one of the plurality of input nodes using a single pole multi throw (SPMT) switch.

55. The method of claim 54, further comprising tuning a matching network coupled to the input port according to the selected one of the plurality of input nodes.

56. A module comprising:
a low noise amplifier (LNA) integrated circuit comprising an amplifier, a coupling capacitor coupled between an input node of the amplifier and an input terminal of the LNA integrated circuit, and a first switch coupled between the input node of the LNA and a reference node terminal;
a single pole multi throw (SPMT) switch coupled between a plurality of module input terminals and a switching network input terminal;
a switching network integrated circuit comprising
the switching network input terminal,
a switching network output terminal coupled to a module output terminal,
a signal path terminal coupled to an output terminal of the LNA integrated circuit,
a second switch coupled between the signal path terminal and the switching network output terminal,
a third switch coupled between the signal path terminal and the reference node terminal,
a fourth switch coupled between the input terminal and an intermediate node,
a fifth switch coupled between the intermediate node and the switching network output terminal,
a sixth switch coupled between the intermediate node and the reference node terminal, and
an adjustable capacitor coupled between the switching network input terminal and the reference node terminal; and
a matching network coupled between the module input terminal and the input terminal of the LNA integrated circuit.

57. The module of claim 56, wherein the coupling capacitor is coupled between a first load path terminal of the first switch and the input terminal of the LNA integrated circuit.

58. The module of claim 56, wherein the SPMT switch is disposed on the switching network integrated circuit.

* * * * *